United States Patent Office 3,421,922
Patented Jan. 14, 1969

3,421,922

PROCESS FOR PRECONDITIONING A NON-METALLIC SURFACE FOR CHEMICALLY DEPOSITING A METAL THEREON

Bruce W. Wilson, Woodbury, Conn. 06798

No Drawing. Filed Mar. 8, 1965, Ser. No. 438,118
U.S. Cl. 117—47 2 Claims
Int. Cl. B44d *1/14;* B44d *1/22*

ABSTRACT OF THE DISCLOSURE

A process is disclosed for the preparation of a non-conductive substrate for electroless deposition thereon of a metal film or plate to improve the adhesion of the metal to the surface of the substrate. The process is characterized by the inclusion of a processing step following the usual chemical etching of the substrate surface and preceding sensitization and activation of that surface, which comprises contacting the surface with a dilute solution of a cationic film-forming water-soluble resin of the group consisting of melamine-formaldehyde-polyalkylene-polyamines, alkylated methylol-melamines, triazine-formaldehyde and alkali metal sulfurous-acid-salt-modified urea-formaldehyde resins.

This invention pertains to a process for improving the wetability and sensitization of the surface of a non-metallic substrate prior to the deposition thereon of a metal plate or film. The invention is directed more particularly to electroless plating of metal on plastics or other non-metallic substrates.

Widespread applications for electroless metal deposits on non-metallic substrates are found in the automotive and appliance industries where the primary function of the metal plate is usually one of decoration. But other applications of even greater commercial importance are in development or already exist in the electronic, nuclear and space exploration fields.

Quite a variety of systems or processes for plating on non-conductive materials such as plastic, glass and ceramics, for example, are known and used extensively today. In general, such systems include preliminary or preparatory steps in which the substrate is made ready to receive the metal plate prior to the step of actually depositing the metal on the surface. These preliminary or pre-plating steps commonly include roughening, etching, cleaning, sensitizing and activating the surface to be plated. All are designed to promote a uniform, adherent deposit of the plating metal. It is well known that to properly deposit a metal chemically on a non-metallic substrate, the surface must be sensitized. To adequately sensitize the substrate, the surface must be completely wetted. Difficulty can arise with improper wetting so that the sensitizing will be non-uniform and give incomplete coverage of the chemically deposited metal. It is a principal objective of this invention to improve wetting of the substrate and to provide a thin film which acts as an absorbent surface for the sensitizing step. This absorbing surface will hold more of the metal ion component of the sensitizing step and produce more uniform and complete sensitization. To this end, the process comprises the preliminary step of contacting the surface of the substrate to be plated with a dilute solution of a cationic film-forming, water-dispersible resin after the chemical etch and prior to the sensitizing step. Resins of this type found to be especially satisfactory include melamine-formaldehyde-polyalkylene-polyamine, alkylated methylol-melamine, triazine-formaldehyde and alkali metal sulfurous-acid-salt-modified urea-formaldehyde resins.

The procedure for the preparation of the substrates using the foregoing resin solutions is quite simple and entirely compatible with the usual pretreatment steps ordinarily involved in electroless plating. That is, the substrate of plastic or other non-conductive material is first cleaned and then subjected to a chemical etch, usually in acid solution, to remove surface glaze to provide a surface better adapted to give good anchorage of the metal deposit to it. The chemical etch serves to microroughen the surface and to render it hydrophilic, inasmuch as the electroless plating solutions are generally water-based.

At this point in the pretreatment, the novel step here disclosed is introduced. In this step, the substrate is dipped in a solution of one of the aforesaid resins, or is sprayed or wiped with a solution thereof, to bring the prepared surface into intimate contact with the solution. The substrate is then rinsed throughly in clear water.

The substrate may be immediately processed through the remaining steps of any conventional plating process, comprising for example the steps of sensitizing, activating and finally depositing the desired metal plate by electroless deposition.

The time of contact of the part with the resin solution is not critical. It may in fact be very brief, amounting to only a few seconds and involving no more than a dipping of the part in the solution and withdrawing it to allow the excess to drain off. The concentration of resin in solution is likewise not especially critical except that for economy a dilute solution containing approximately 1% of resin solids by weight is preferred. It appears that solutions, or more accurately aqueous dispersions, of up to 10% by weight of resin are operative, while at the other extreme, the benefits of the invention are often realized to substantial degree with solutions containing less than 0.1%. Normal plating practice in regard to temperature of the solution can be followed, and in general a solution temperature of anything from room temperature to something below the boiling point is operative.

Various resins suitable for the purposes of this invention, and the manner in which such resins can be prepared, are described in prior U.S. patents. All of the resins are characterized generally as water-soluble or water-dispersible polymers which produce a cationic charge when brought in contact with the surface of the substrate. The melamine resins are polyamine compounds prepared by reaction of a polyfunctional amine or salt thereof with urea and formaldehyde. Alternatively they may be formed by reaction of the amine with the condensation product of urea and formaldehyde at a pH and temperature giving no viscosity increase, followed by aging at a pH and temperature such that viscosity increases steadily at a controllable rate. The resulting resin in its normal water-dispersible form contains more than about 5 mols of combined formaldehyde per mol of combined melamine, and the ratio of the number of nitrogen atoms in the polyalkylene-polyamine to the number of molecules of melamine is between 0.3:1 and 10:1. A procedure for the preparation of such materials is given in U.S. patent No. 2,796,362 and further reference to that patent is here made for a more complete disclosure.

Suitable alkylated methylol melamine resins are disclosed in U.S. Patent No. 2,715,619, while alkali metal sulfurous acid-salt-modified urea-formaldehyde resins are disclosed in U.S. Patent No. 2,559,578. The disclosures of both of these patents are expressly referred to and incorporated herein by way of further example of resins useful in practicing this invention.

Resins of the foregoing types are currently available commercially under various trade names. For example, "Accobond," No. 3900 or 3913, are manufactured by American Cyanamid Co.; "Uformite," No. 467 or 700, are manufactured by Rohm & Haas Co.; and "Kymene," No. 557 or No. 754, are manufactured by Hercules Powder Co.

The following specific example of a process for electroless copper plating on a plastic substrate is given to illustrate the invention.

EXAMPLE I

A sheet of ABS (acrylonitrile butadiene styrene) is prepared for electroless copper plating by scrubbing with an abrasive slurry of pumice and trisodium phosphate. Thereafter the substrate is etched to produce the desired hydrophilic surface by immersion for 1–2 minutes at room temperature in a sulfuric-chromic etchant of the following composition:

| | | |
|---|---|---|
| $CrO_3$ | oz./gal. | 10 |
| $H_2SO_4$ | fl. oz./gal. | 32 |

The substrate is then conditioned for subsequent sensitizing, etc. by dipping in a 1.0% to 1.5% by weight aqueous solution of "Uformate 700." The solution may be at room temperature and the time of immersion need not exceed 5 seconds. Upon removal, the sheet is drained and then rinsed thoroughly in running water.

The conditioned sheet is ready immediately for sensitizing in a bath of the following composition:

| | | |
|---|---|---|
| $SnCl_2$ | g. | 10 |
| HCl | ml. | 40 |
| $H_2O$ | ml. | 1000 |

This solution is maintained at room temperature and the sheet soaked for a period of 1–2 minutes, with mild agitation.

On completion of the foregoing step, the sheet substrate is drained, rinsed carefully and placed in an activating or accelerating solution of the following composition:

| | | |
|---|---|---|
| $PdCl_2$ | g. | 1 |
| HCl | ml. | 10 |
| $H_2O$ | gal. | 1 |

This solution preferably is maintained at a temperature of about 125° F. Again the time of soaking may be 1–2 minutes, after which the substrate is drained and again thoroughly rinsed in water.

The pretreated substrate is now ready for plating which in this example is to be an electroless copper deposit. A suitable copperizing bath for this purpose may have the following composition:

| | | |
|---|---|---|
| $CuSO_4$ | g./l. | 29 |
| Rochelle salt | g./l. | 140 |
| NaOH | g./l. | 40 |
| Formaldehyde (37% solution) | g./l. | 166 |

This solution is used at room temperature and the preconditioned sheet is held in solution until an adequate deposit is obtained.

In place of the "Uformite 700," any of the other nitrogenous amino-plastic compositions above described may be employed. Excellent results for example, are obtained using a solution of 5% by weight of "Accobond 3900" in water.

In all cases the film of resin adhering to the substrate is so thin as to be quite unnoticeable to the naked eye. The quantity which does adhere therefore is very small, and this is all that is necessary or desired. The added step is accordingly very economical and practical.

What is claimed is:

1. In an electroless plating process of chemically depositing copper on the surface of a non-conductive substrate the steps of chemically etching the substrate surface, rinsing in water, contacting the surface of the substrate with a dilute solution of a cationic film-forming, water-soluble resin selected from the group consisting of melamine - formaldehyde - polyalkylene - polyamine, alkylated methylol melamine, triazine-formaldehyde and alkali metal sulfurous-acid-salt-modified urea-formaldehyde resins, rinsing said substrate in water to remove excess resin, sensitizing and activating said surface by contacting it with stannous chloride and palladium chloride in solution to promote the self-sustained deposition of copper thereon and then contacting said surface with a solution of a copper salt and a reducing agent.

2. The process as defined in claim 1, wherein said solution of cationic film-forming water-soluble resin contains from about 0.5 to 1.0% by weight of said resin.

References Cited

UNITED STATES PATENTS

| | | | |
|---|---|---|---|
| 2,796,362 | 6/1957 | Wooding et al. | 117—71 |
| 2,917,439 | 12/1959 | Liu | 117—71 XR |
| 3,033,703 | 5/1962 | Schneble et al. | 117—47 |
| 3,222,218 | 12/1965 | Beltzer et al. | 117—47 XR |

RALPH S. KENDALL, *Primary Examiner.*

THOMAS E. BOKAN, *Assistant Examiner.*

U.S. Cl. X.R.

117—54, 71, 72, 124, 160, 161